US010778178B2

(12) United States Patent
Ghim et al.

(10) Patent No.: US 10,778,178 B2
(45) Date of Patent: Sep. 15, 2020

(54) FRONT END MODULE SUPPORTING DEVICE TO DEVICE COMMUNICATION USING PLURAL FREQUENCY BANDS AND ELECTRONIC DEVICE INCLUDING THE SAME

(71) Applicant: Samsung Electronics Co., Ltd., Suwon-si, Gyeonggi-do (KR)

(72) Inventors: Jaegon Ghim, Hwaseong-si (KR); Jeongho Kang, Suwon-si (KR); Namwoo Kim, Hwaseong-si (KR); Yunbum Lee, Osan-si (KR); Haimin Lee, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/899,121

(22) Filed: Feb. 19, 2018

(65) Prior Publication Data
US 2018/0241369 A1   Aug. 23, 2018

(30) Foreign Application Priority Data

Feb. 21, 2017  (KR) .................. 10-2017-0023043

(51) Int. Cl.
  *H03H 7/46* (2006.01)
  *H04B 1/00* (2006.01)
  (Continued)

(52) U.S. Cl.
  CPC ............. *H03H 7/46* (2013.01); *H04B 1/00* (2013.01); *H04B 1/006* (2013.01); *H04B 1/0057* (2013.01);
  (Continued)

(58) Field of Classification Search
  CPC .......... H03H 7/46; H04B 1/00; H04B 1/0057; H04B 1/006; H04B 1/28; H04B 1/403;
  (Continued)

(56) References Cited

U.S. PATENT DOCUMENTS 8,311,554 B2 * 11/2012 Abedi ................... H04W 16/14
                                                            370/230
2003/0193923 A1   10/2003 Abdelgany et al.
(Continued)

FOREIGN PATENT DOCUMENTS

| EP | 3029843 A1 | 6/2016 |
| KR | 10-2006-0025150 A | 3/2006 |
| KR | 10-2014-0131761 A | 11/2014 |

OTHER PUBLICATIONS

Partial European Search Report dated Jun. 19, 2018 in connection with European Patent Application No. 18 15 7837.
(Continued)

*Primary Examiner* — Asad M Nawaz
*Assistant Examiner* — Kai Chang

(57) ABSTRACT

A front end module supporting a plurality of frequency bands and an electronic device includes a plurality of duplexers, a first switch configured to connect any one of the plurality of duplexers to an antenna, a second switch configured to connect a first port, to which a Tx signal of a first communication or a Tx signal of a second communication is input, to any one of Tx ports of the plurality of duplexers, and to connect a second port, from which a Rx signal of the second communication is output, to one of the Tx ports of the plurality of duplexers. According to certain embodiments, the number of switches occupying a large space can be minimized, and thus a space occupied by the front end module supporting device to device (D2D) communication can be reduced.

7 Claims, 11 Drawing Sheets

(51) Int. Cl.
  *H04B 1/28* (2006.01)
  *H04W 88/02* (2009.01)
  *H04W 72/04* (2009.01)
  *H04W 8/00* (2009.01)
  *H04B 1/403* (2015.01)

(52) U.S. Cl.
  CPC .............. *H04B 1/28* (2013.01); *H04B 1/403* (2013.01); *H04B 1/406* (2013.01); *H04W 8/005* (2013.01); *H04W 72/042* (2013.01); *H04W 72/0453* (2013.01); *H04W 88/02* (2013.01)

(58) Field of Classification Search
  CPC .... H04B 1/406; H04B 7/0404; H04B 7/0802; H04W 8/005; H04W 72/042; H04W 72/0453; H04W 88/02
  See application file for complete search history.

(56) References Cited

U.S. PATENT DOCUMENTS

| | | | | |
|---|---|---|---|---|
| 2007/0054628 | A1* | 3/2007 | Rowe | H04B 1/28 455/78 |
| 2007/0151358 | A1 | 7/2007 | Bogdan | |
| 2010/0134202 | A1 | 6/2010 | Leinonen et al. | |
| 2011/0260806 | A1* | 10/2011 | Takeuchi | H03H 7/38 333/103 |
| 2012/0243447 | A1* | 9/2012 | Weissman | H04B 1/0458 370/280 |
| 2012/0294205 | A1* | 11/2012 | Fan | H04B 1/0057 370/280 |
| 2013/0072134 | A1 | 3/2013 | Goto et al. | |
| 2013/0122831 | A1 | 5/2013 | Desclos et al. | |
| 2013/0285862 | A1* | 10/2013 | De Luis | H01Q 1/243 343/722 |
| 2013/0336181 | A1* | 12/2013 | Khlat | H04L 5/06 370/297 |
| 2014/0003300 | A1 | 1/2014 | Weissman et al. | |
| 2014/0328267 | A1 | 11/2014 | Ryu et al. | |
| 2015/0340769 | A1* | 11/2015 | Desclos | H01Q 21/0006 343/745 |
| 2016/0119003 | A1* | 4/2016 | Granger-Jones | H04B 1/006 370/276 |
| 2016/0127026 | A1* | 5/2016 | Wloczysiak | H04B 7/08 370/230 |
| 2016/0262145 | A1 | 9/2016 | Park | |
| 2016/0276983 | A1* | 9/2016 | Vaillancourt | H04B 1/18 |
| 2016/0337025 | A1* | 11/2016 | Xu | H01Q 1/243 |
| 2017/0077967 | A1* | 3/2017 | Srirattana | H04B 1/0458 |
| 2017/0279566 | A1* | 9/2017 | Liu | H04L 5/00 |
| 2017/0302317 | A1* | 10/2017 | Horita | H04B 1/00 |
| 2018/0152945 | A1* | 5/2018 | Balteanu | H04L 5/14 |

OTHER PUBLICATIONS

European Search Report dated Oct. 12, 2018 in connection with European Patent Application No. 18 15 7837, 12 pages.

* cited by examiner

FRONT END MODULE SUPPORTING DEVICE TO DEVICE COMMUNICATION USING PLURAL FREQUENCY BANDS AND ELECTRONIC DEVICE INCLUDING THE SAME

CROSS-REFERENCE TO RELATED APPLICATION AND CLAIM OF PRIORITY

This application is related to and claims priority to Korean Patent Application No. 10-2017-0023043, filed on Feb. 21, 2017, the contents of which are incorporated herein by reference.

TECHNICAL FIELD

The present disclosure relates to a front end module supporting a plurality of frequency bands and an electronic device including the front end module.

BACKGROUND

With the spread of various electronic devices, such as a smart phone, a tablet PC, a portable multimedia player (PMP), a personal digital assistant (PDA), a laptop PC, and a wearable device, various wireless communication technologies used for the various electronic devices to perform communication have been developed.

Recently, as one of the next-generation mobile communication systems, standardization work for a long term evolution (LTE) system has considerably been done in $3^{rd}$ generation partnership project (3GPP). The LTE system is a technology to implement high-speed packet based communication having a transmission speed of about 100 Mbps, and has currently been commercialized.

Further, research for device to device (D2D) communication has been under way as as an aspect of the LTE system standards. D2D communication refers generally to a communication scheme for enabling user terminals that support the LTE system to perform communication with each other without passing through a base station. That is, the D2D communication technology is a technology whereby a D2D radio link is configured between adjacent devices through a wireless mobile communication interface using a mobile communication frequency band, and data is directly transmitted and received between the devices through the D2D radio link without passing through the base station.

SUMMARY

According to embodiments of the present disclosure, the D2D functionality of wireless devices is augmented in that D2D communication is performed using a part of an uplink frequency band defined in the LTE system. For the purposes of this disclosure, the uplink frequency band encompasses a frequency band used when a user terminal transmits a signal to a base station. Accordingly, a front end module connected to an antenna of the existing user terminal is unable to support the D2D communication, and thus the front end module should be newly configured.

Further, in order for a front end module supporting a plurality of frequency bands to support the D2D communication, components associated with the respective frequency bands are increased, and this can result in a space required to install the front end module therein to be increased.

One, non-limiting aspect of the present disclosure is related to a front end module supporting an LTE D2D communication and an electronic device including the front end module.

In accordance with aspects of the present disclosure, a communication circuit of an electronic device includes a plurality of duplexers, a first switch configured to connect any one of the plurality of duplexers to an antenna, and a second switch configured to connect a first port, to which a Tx signal of a first communication or a Tx signal of a second communication is input, to any one of Tx ports of the plurality of duplexers, and to connect a second port, from which a Rx signal of the second communication is output, to one of the Tx ports of the plurality of duplexers, wherein the first communication supports frequency division multiplexing, and the second communication support time division multiplexing.

According to certain embodiments of the present disclosure, a communication circuit of an electronic device includes a plurality of duplexers; a first switch configured to connect one of the plurality of duplexers to an antenna, a second switch configured to connect any one of Rx ports of the plurality of duplexers to a Rx port of a first communication, and a third switch configured to connect any one of Tx ports of the plurality of duplexers to a Rx port of a second communication.

According to some embodiments of the present disclosure, an electronic device includes a first front end module connected to a first antenna, and a second front end module connected to a second antenna interlocking with the first antenna to perform diversity reception, wherein the first front end module includes a plurality of duplexers, a first switch configured to connect the first antenna to any one of the plurality of duplexers; a first transmission band filter connected to an auxiliary port of the first switch to filter a Rx signal of a second communication, and a plurality of ports connected to the plurality of duplexers and the transmission band filter, and the second front end module includes a plurality of reception band filters configured to filter Rx signals of a first communication among signals received from the second antenna, a low-noise amplifier connected to the plurality of reception band filters, a second switch configured to connect the second antenna to one of the plurality of reception band filters, and a second transmission band filter connected to an auxiliary port of the second switch to filter the Rx signal of the second communication.

According to certain embodiments of the present disclosure, an electronic device includes a first front end module connected to a first antenna, and a second front end module connected to a second antenna interlocking with the first antenna to perform diversity reception, wherein the first front end module includes a plurality of reception filters configured to filter a received signal of a first communication from signals received from the first antenna, a plurality of ports respectively connected to the plurality of reception filters, and a first switch configured to connect the first antenna to any one of the plurality of reception filters, and the second front end module includes a plurality of duplexers connected to an auxiliary port of the first switch to filter a Rx signal and a Tx signal of a second communication among signals received from the first antenna, a second switch configured to connect one of Tx ports of the plurality of duplexers to a first amplifier, a third switch configured to connect one of Rx ports of the plurality of duplexers to a second amplifier, and a plurality of ports connected to the first amplifier and the second amplifier.

According to certain embodiments, the front end module supports a plurality of frequency bands and the electronic device includes the same, since the transmission band filter capable of filtering the Rx signal of D2D is, in certain embodiments, connected to an AUX terminal existing in the switch of the existing front end module, the D2D communication can be supported without any change of the existing front end module structure.

Further, according to certain embodiments, the front end module supports a plurality of frequency bands and the number of switches occupying a large space is minimized, the space occupied by the front end module supporting the D2D communication can be reduced.

Further, according to certain embodiments, the front end module supports a plurality of frequency bands and the electronic device includes the same. Accordingly, since signal lines through which the Rx signals corresponding to the D2D communication are transmitted can be reduced to one line, a space occupied by the D2D Rx reception ports can be reduced.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
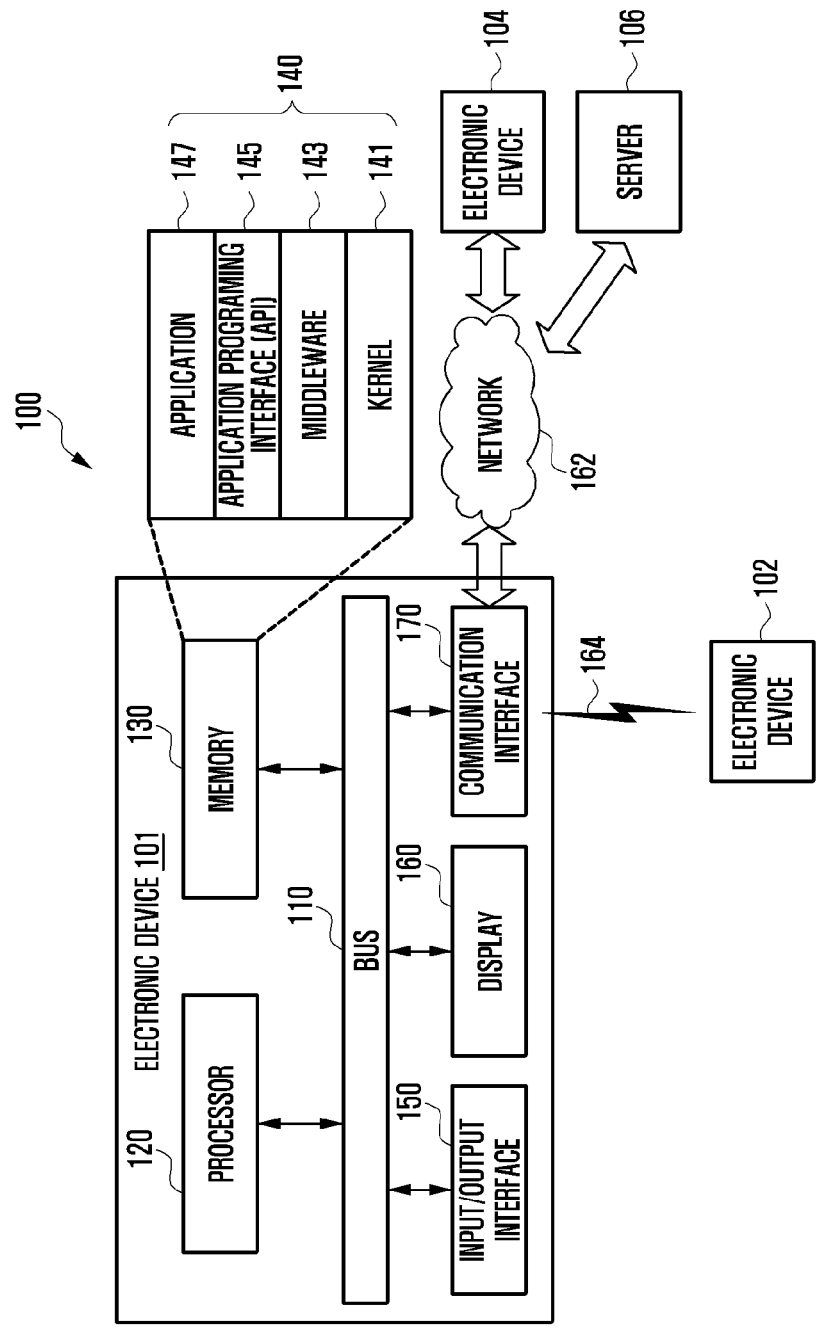
FIG. 1 illustrates an electronic device in a network environment according to various embodiments of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The following description is made with reference to the accompanying drawings and is provided to assist in a comprehensive understanding of various example embodiments of the present disclosure as defined by the claims and their equivalents. It includes various specific details to assist in that understanding but these are to be regarded as merely examples. Accordingly, those of ordinary skill in the art will recognize that various changes and modifications of the various example embodiments described herein can be made without departing from the scope and spirit of the present disclosure. In addition, descriptions of well-known functions and constructions may be omitted for clarity and conciseness.

The terms and words used in the following description and claims are not limited to their dictionary definitions, but, may simply be used to enable a clear and consistent understanding of the present disclosure. Accordingly, it should be apparent to those skilled in the art that the following description of various example embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "substantially" may generally denote that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The expressions, such as "include" and "may include" which may be used in the present disclosure may refer, for example, to the presence of the disclosed functions, operations, and constituent elements and do not limit one or more additional functions, operations, and elements. In an example embodiment of the present disclosure, the terms, such as "include" and/or "have" may be understood to refer, for example, to a certain characteristic, number, operation, constituent element, component or a combination thereof, but may not be construed to exclude the existence of or a possibility of addition of one or more other characteristics, numbers, operations, constituent elements, components or combinations thereof.

Furthermore, in the present disclosure, the expression "and/or" includes any and all combinations of the associated listed words. For example, the expression "A and/or B" may include A, may include B, or may include both A and B.

In exemplary embodiments of the present disclosure, expressions including ordinal numbers, such as "first" and "second," and the like, may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

In the case where a component is referred to as being "connected" or "accessed" to other component, it should be understood that not only the component is directly connected or accessed to the other component, but also there may exist another component between them. Meanwhile, in the case where a component is referred to as being "directly connected" or "directly accessed" to other component, it should be understood that there is no component therebetween.

An electronic device according to the present disclosure may be a device including a communication function. For example, and without limitation, the device may correspond to a combination of at least one of a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a television (TV), a digital versatile disc (DVD) player, an audio device, various medical devices (for example, magnetic resonance angiography (MRA), magnetic resonance imaging (MRI), computed tomography (CT), a scanning machine, a ultrasonic wave device, and the like), a navigation device, a global positioning system (GPS) receiver, an event data recorder (EDR), a flight data recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, and the like), avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, a projector, or the like. It will be apparent to those skilled in the art that the electronic device according to the present disclosure is not limited to the aforementioned devices.

FIG. 1 illustrates, in block diagram format, an example of electronic devices in a network environment 100 according to certain embodiments of the present disclosure.

Referring to FIG. 1, an electronic device 101 may include a bus 110, a processor (e.g., including processing circuitry) 120, a memory 130, an input/output interface (e.g., including interface circuitry) 150, a display 160, a communication interface (e.g., including communication circuitry) 170, and other similar and/or suitable components.

The bus 110 may be a circuit which interconnects the above-described elements and delivers a communication (e.g., a control message) between the above-described elements.

The processor 120 may include various processing circuitry and receive commands from the above-described other elements (e.g., the memory 130, the input/output interface 150, the display 160, the communication 170, and the like) through the bus 110, may interpret the received commands, and may execute calculation or data processing according to the interpreted commands. Although illustrated as one element, the processor 120 may include multiple processors without departing from the teachings herein. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The memory 130 may store commands or data received from the processor 120 or other elements (e.g., the input/output interface 150, the display 160, the communication interface 170, and the like) or generated by the processor 120 or the other elements. The memory 130 may include programming modules 140, such as a kernel 141, middleware 143, an application programming interface (API) 145, an application 147, and the like. Each of the above-described programming modules may be implemented in software, firmware, hardware, or a combination of two or more thereof.

The kernel 141 may control or manage system resources (e.g., the bus 110, the processor 120, the memory 130, and the like) used to execute operations or functions implemented by other programming modules (e.g., the middleware 143, the API 145, and the application 147). In addition, the kernel 141 may provide an interface capable of accessing and controlling or managing the individual elements of the electronic device 101 by using the middleware 143, the API 145, or the application 147.

The middleware 143 may serve to go between the API 145 or the application 147 and the kernel 141 in such a manner that the API 145 or the application 147 communicates with the kernel 141 and exchanges data therewith. In addition, in relation to work requests received from one or more applications 147 and/or the middleware 143, for example, may perform load balancing of the work requests by using a method of assigning a priority, in which system resources (e.g., the bus 110, the processor 120, the memory 130, and the like) of the electronic device 101 can be used, to at least one of the one or more applications 147.

According to certain embodiments, API 145 is an interface through which the application 147 is capable of controlling a function provided by the kernel 141 or the middleware 143, and may include, for example, at least one interface or function for file control, window control, image processing, character control, and the like.

The input/output interface 150 may include various interface circuitry and, for example, may receive a command or data as input from a user, and may deliver the received command or data to the processor 120 or the memory 130 through the bus 110. The display 160 may display a video, an image, data, and the like, to the user.

The communication interface 170 may include various communication circuitry and connect communication between electronic devices 102 and 104 and the electronic device 101. The communication interface 170 may support a short-range communication protocol (e.g., Wi-Fi, Bluetooth (BT), and near field communication (NFC)), or a network communication (e.g., the internet, a local area network (LAN), a wide area network (WAN), a telecommunication network, a cellular network, a satellite network, a plain old telephone service (POTS), and the like). Each of the electronic devices 102 and 104 may be a device which is identical (e.g., of an identical type) to or different (e.g., of a different type) from the electronic device 101. Further, the communication interface 170 may connect communication between a server 106 and the electronic device 101 via the network 162.

Figure 2:
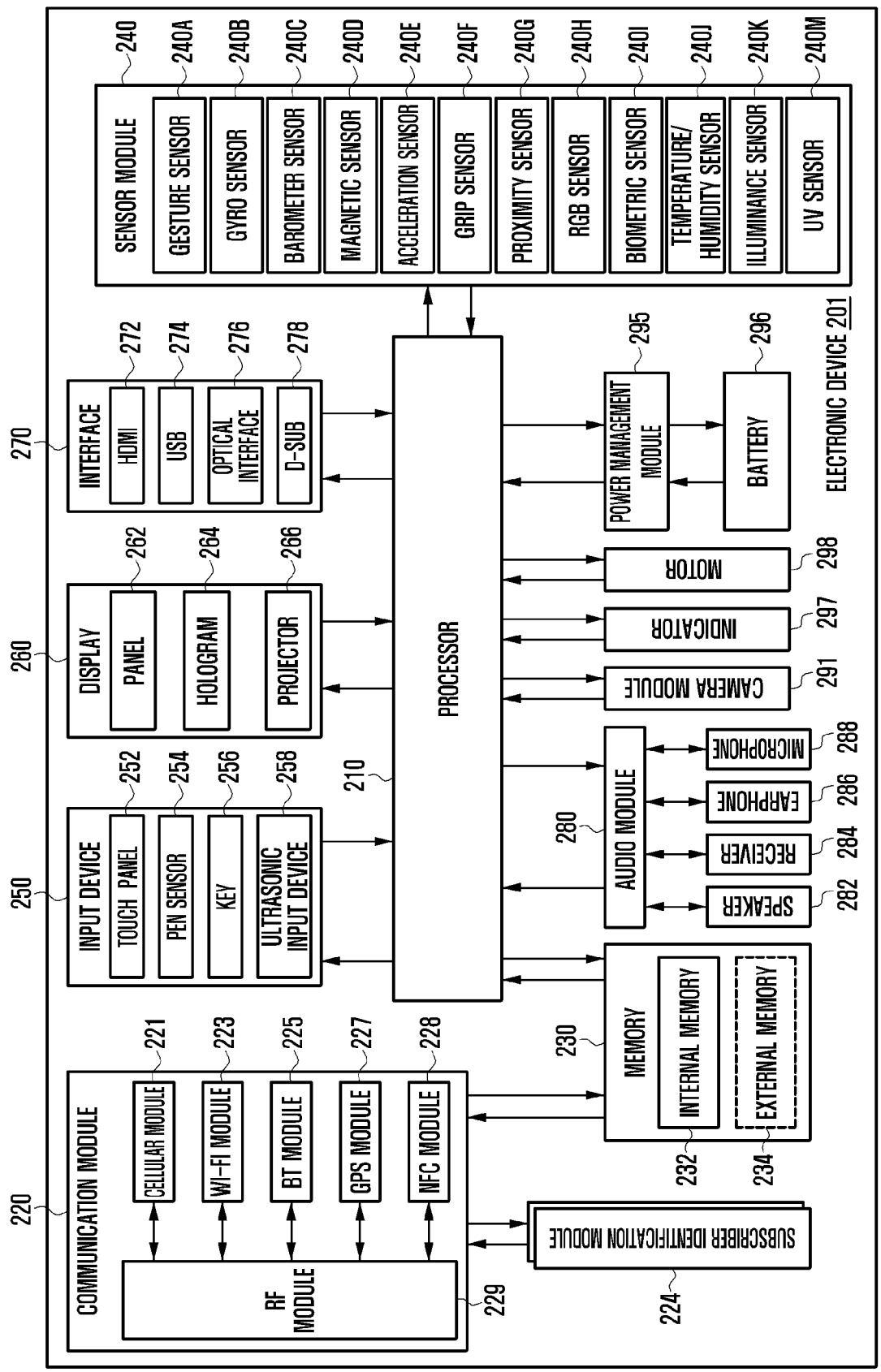
FIG. 2 illustrates, in block diagram format, an electronic device according to various embodiments of the present disclosure.

FIG. 2 illustrates, in block diagram format, an example of an electronic device according to certain exemplary embodiments of the present disclosure.

Referring to FIG. 2, an electronic device 201 may be, for example, the electronic device 101 illustrated in FIG. 1.

Referring to FIG. 2, the electronic device 201 may include a processor (e.g., and application processor including processing circuitry) 210, a subscriber identification module (SIM) card 224, a memory 230, a communication module (e.g., including communication circuitry) 220, a sensor module 240, an input device (e.g., including input circuitry) 250, a display 260, an interface (e.g., including interface circuitry) 270, an audio module (coder/decoder (codec)) 280, a camera module 291, a power management module 295, a battery 296, an indicator 297, a motor 298 and any other similar and/or suitable components.

The processor 210 may include various processing circuitry, such as, for example, and without limitation, one or more of a dedicated processor, a CPU, application processors (APs) (not illustrated), or one or more communication processors (CPs) (not illustrated). The processor 210 may be, for example, the processor 120 illustrated in FIG. 1. The AP and the CP may be included in the processor 210 in FIG. 2, or may be included in different integrated circuit (IC) packages, respectively. According to an embodiment of the present disclosure, the AP and the CP may be included in one IC package.

The AP may execute an operating system (OS) or an application program, and thereby may control multiple hardware or software elements connected to the AP and may perform processing of and arithmetic operations on various data including multimedia data. The AP may be implemented by, for example, a system on chip (SoC). According to an embodiment of the present disclosure, the processor 210 may further include a graphical processing unit (GPU) (not illustrated).

The CP may manage a data line and may convert a communication protocol in the case of communication between the electronic device (e.g., the electronic device 101) including the electronic device 201 and different electronic devices connected to the electronic device through the network. The CP may be implemented by, for example, a SoC. According to certain embodiments of the present disclosure, the CP may perform at least some of multimedia control functions. The CP, for example, may distinguish and authenticate a terminal in a communication network by using a SIM (e.g., the SIM card 224). In addition, the CP may provide the user with services, such as a voice telephony call, a video telephony call, a text message, packet data, and the like.

Further, the CP may control the transmission and reception of data by the communication module 220. In FIG. 2, the elements, such as the power management module 295, the memory 230, and the like are illustrated as elements separate from the processor 210. However, according to at least one embodiment of the present disclosure, the processor 210 may include at least some of the above-described elements (e.g., the power management module 295).

According certain exemplary embodiments of the present disclosure, the AP or the CP may load, to a volatile memory, a command or data received from at least one of a non-volatile memory and other elements connected to each of the AP and the CP, and may process the loaded command or data. In addition, the AP or the CP may store, in a non-volatile memory, data received from or generated by at least one of the other elements.

According to some embodiments, SIM card 224 may be a card implementing a SIM, and may be inserted into a slot formed in a particular portion of the electronic device 201. The SIM card 224 may include unique identification information (e.g., IC card identifier (ICCID)) or subscriber information (e.g., international mobile subscriber identity (IMSI)).

The memory 230 may include an internal memory 232 and/or an external memory 234. The memory 230 may be, for example, the memory 130 illustrated in FIG. 1. The internal memory 232 may include, for example, at least one of a volatile memory (e.g., a dynamic random access memory (DRAM), a static RAM (SRAM), a synchronous dynamic RAM (SDRAM), and the like), and a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a not AND (NAND) flash memory, a not OR (NOR) flash memory, and the like). According to an embodiment of the present disclosure, the internal memory 232 may be in the form of a solid state drive (SSD). The external memory 234 may further include a flash drive, for example, a compact flash (CF), a secure digital (SD), a micro-SD, a mini-SD, an extreme digital (xD), a memory stick, and the like.

The communication module 220 may include various communication circuitry including, for example, and without limitation, a radio frequency (RF) module 229. The communication module 220 may be, for example, the communication interface 170 illustrated in FIG. 1. The communication module 220 may further include various communication circuitry including, for example, and without limitation, wireless communication modules to enable wireless communication through the RF module 229. The wireless communication modules may include, for example, and without limitation, a cellular module 221, a Wi-Fi module 223, a BT module 225, a GPS module 227, and/or a NFC module 228. Additionally or alternatively, the wireless communication modules may further include a network interface (e.g., a LAN card), a modulator/demodulator (modem), and the like for connecting the electronic device 201 to a network (e.g., the internet, a LAN, a WAN, a telecommunication network, a cellular network, a satellite network, a POTS, and the like) (not illustrated).

The communication module 220 (e.g., the communication interface 170) may perform data communication with other electronic devices (e.g., the electronic devices 102 and 104, and the server 106) through a network (e.g., network 162).

The RF module 229 may be used for transmission and reception of data, for example, transmission and reception of RF signals or called electronic signals. Although not illustrated, the RF unit 229 may include, for example, a transceiver, a power amplifier module (PAM), a frequency filter, a low noise amplifier (LNA), and the like. In addition, the RF module 229 may further include a component for transmitting and receiving electromagnetic waves in a free space in a wireless communication, for example, a conductor, a conductive wire, and the like.

The sensor module 240 may include, for example, at least one of a gesture sensor 240A, a gyro sensor 240B, an atmospheric pressure (e.g., barometer) sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illuminance (e.g., light) sensor 240K, and an ultra violet (UV) sensor 240M. The sensor module 240 may measure a physical quantity or may detect an operating state of the electronic device 201, and may convert the measured or detected information to an electrical signal. Additionally/alternatively, the sensor module 240 may include, for example, an electronic nose (E-nose) sensor (not illustrated), an electromyography (EMG) sensor (not illustrated), an electroencephalogram (EEG) sensor (not illustrated), an electrocardiogram (ECG) sensor (not illustrated), a fingerprint sensor (not illustrated), and the like. Additionally or alternatively, the sensor module 240 may include, for example, an E-nose sensor (not illustrated), an EMG sensor (not illustrated), an EEG sensor (not illustrated), an ECG sensor (not illustrated), a fingerprint sensor, and the like. The sensor module 240 may further include a control circuit (not illustrated) for controlling one or more sensors included therein. The sensor module 240 may also, or in the alternative, be controlled by the processor 210.

The input device 250 may include various input circuitry, such as, for example, and without limitation, a touch panel 252, a pen sensor 254 (e.g., a digital pen sensor), keys 256, and an ultrasonic input device 258. The input device 250 may be, for example, the input/output interface 150 illustrated in FIG. 1. The touch panel 252 may recognize a touch input in at least one of, for example, a capacitive scheme, a resistive scheme, an infrared scheme, and an acoustic wave scheme. In addition, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input device 258 enables the terminal to detect a sound wave by using a microphone (e.g., a microphone 288) of the terminal through a pen generating an ultrasonic signal, and to identify data. The ultrasonic input device 258 is capable of wireless recognition. According to an embodiment of the present disclosure, the electronic device 201 may receive a user input from an external device (e.g., a network, a computer, or a server), which is connected to the electronic device 201, through the communication module 220.

The display 260 may include a panel 262, a hologram 264, and a projector 266. The display 260 may be, for example, the display 160 illustrated in FIG. 1. The panel 262 may be, for example, a liquid crystal display (LCD) and an active matrix organic light emitting diode (AM-OLED) display, or the like, but is not limited thereto. The panel 262 may be implemented so as to be, for example, flexible, transparent, or wearable. The panel 262 may include the touch panel 252 and one module. The hologram 264 may display a three-dimensional image in the air by using interference of light. The projector 266 may include light-projecting elements, such as LEDs, to project light into external surfaces. According to an embodiment of the present disclosure, the display 260 may further include a control circuit for controlling the panel 262, the hologram 264, or the projector 266.

The interface 270 may include various interface circuitry, such as, for example, and without limitation, a high-definition multimedia interface (HDMI) 272, a universal serial bus (USB) 274, an optical interface 276, and a d-subminiature (D-sub) 278. Additionally or alternatively, the interface 270 may include, for example, SD/multi-media card (MMC) (not illustrated) or infrared data association (IrDA) (not illustrated).

The audio module (codec) 280 may convert a voice signal to an electrical signal and vice versa. The audio module 280 may convert voice information, which is input to or output from the audio module 280, through, for example, a speaker 282, a receiver 284, an earphone 286, the microphone 288, and the like.

The camera module 291 may capture an image and a moving image. According to an embodiment of the present disclosure, the camera module 291 may include one or more image sensors (e.g., a front lens or a back lens), an image signal processor (ISP) (not illustrated), and a flash LED (not illustrated).

The power management module 295 may manage power of the electronic device 201. Although not illustrated, the power management module 295 may include, for example, a power management IC (PMIC), a charger IC, or a battery fuel gauge.

The PMIC may be mounted to, for example, an IC or an SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, and the like) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the electronic device 201 or a part of the electronic device 201 (e.g., the AP), for example, a booting state, a message state, a charging state and the like. The motor 298 may convert an electrical signal into a mechanical vibration.

Although not illustrated, the electronic device 201 may include a processing unit (e.g., a GPU) for supporting a module TV. The processing unit for supporting a module TV may process media data according to standards, such as, for example, digital multimedia broadcasting (DMB), digital video broadcasting (DVB), media flow, and the like. Each of the above-described elements of the electronic device 201 according to an embodiment of the present disclosure may include one or more components, and the name of the relevant element may change depending on the type of electronic device. The electronic device 201 according to an embodiment of the present disclosure may include at least one of the above-described elements. Some of the above-described elements may be omitted from the electronic device 201, or electronic device 201 may further include additional elements. In addition, some of the elements of the electronic device 201 according to an embodiment of the present disclosure may be combined into one entity, which may perform functions identical to those of the relevant elements before the combination.

The term "module" used in the present disclosure may refer to, for example, a unit including one or more combinations of hardware, software, and firmware. The "module" may be interchangeable with a term, such as "unit," "logic," "logical block," "component," "circuit," and the like. The "module" may be a minimum unit of a component formed as one body or a part thereof. The "module" may be a minimum unit for performing one or more functions or a part thereof. The "module" may be implemented mechanically or electronically. For example, the "module" according to an example embodiment of the present disclosure may include at least one of a dedicated processor, a CPU, an application-specific integrated circuit (ASIC) chip, a field-programmable gate array (FPGA), and a programmable-logic device for performing certain operations which have been known or are to be developed in the future.

Figure 3:
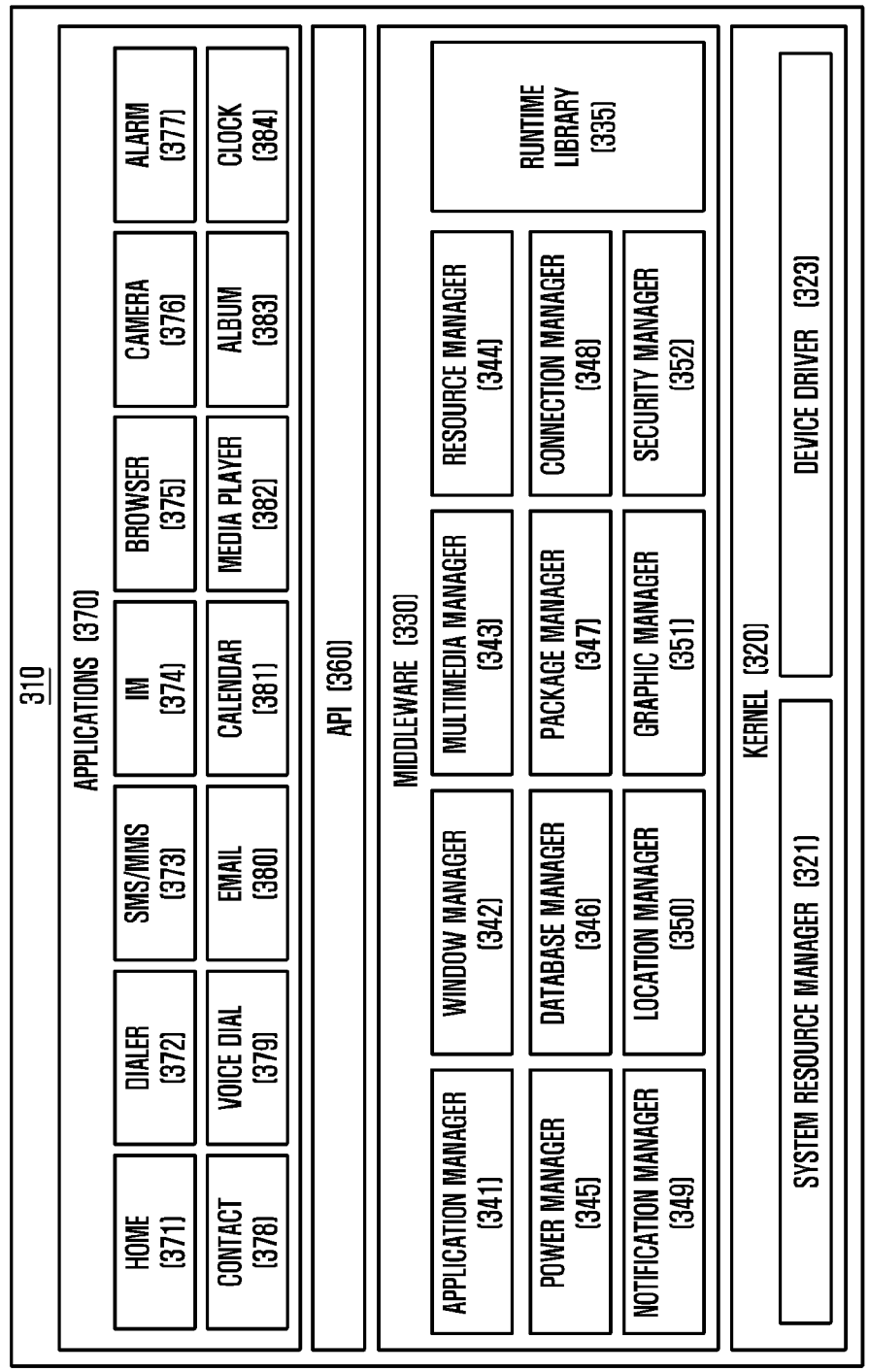
FIG. 3 illustrates, in block diagram format, a program module according to various embodiments of the present disclosure.

FIG. 3 illustrates, in block diagram format, an example of configuration of a programming module according to exemplary embodiments of the present disclosure.

Referring to FIG. 3, a programming module 300 may be included (or stored) in the electronic device 101 (e.g., the memory 130) or may be included (or stored) in the electronic device 201 (e.g., the memory 230) illustrated in FIG. 1. At least a part of the programming module 300 may be implemented in software, firmware, hardware, or a combination of two or more thereof. The programming module 300 may be implemented in hardware (e.g., the electronic device 201), and may include an OS controlling resources related to an electronic device (e.g., the electronic device 101) and/or various applications (e.g., an application 370) executed in the OS. For example, the OS may be Android, iOS, Windows, Symbian, Tizen, Bada, and the like.

Referring to FIG. 3, the programming module 300 may include a kernel 320, a middleware 330, an API 360, and/or the application 370.

The kernel 320 (e.g., the kernel 141) may include a system resource manager 321 and/or a device driver 323. The system resource manager 321 may include, for example, a process manager (not illustrated), a memory manager (not illustrated), and a file system manager (not illustrated). The system resource manager 321 may perform the control, allocation, recovery, and the like of system resources. The device driver 323 may include, for example, a display driver (not illustrated), a camera driver (not illustrated), a BT driver (not illustrated), a shared memory driver (not illustrated), a USB driver (not illustrated), a keypad driver (not illustrated), a Wi-Fi driver (not illustrated), and/or an audio driver (not illustrated). In addition, according to an embodiment of the present disclosure, the device driver 323 may include an inter-process communication (IPC) driver (not illustrated).

The middleware 330 may include multiple modules previously implemented so as to provide a function used in common by the applications 370. In addition, the middleware 330 may provide a function to the applications 370 through the API 360 in order to enable the applications 370 to efficiently use limited system resources within the electronic device. For example, as illustrated in FIG. 3, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include, for example, a library module used by a complier, in order to add a new function by using a programming language during the execution of the application 370. According to an embodiment of the present disclosure, the runtime library 335 may perform functions which are related to input and output, the management of a memory, an arithmetic function, and the like.

The application manager 341 may manage, for example, a life cycle of at least one of the applications 370. The window manager 342 may manage graphical user interface (GUI) resources used on the screen. The multimedia manager 343 may detect a format used to reproduce various media files and may encode or decode a media file through a codec appropriate for the relevant format. The resource manager 344 may manage resources, such as a source code, a memory, a storage space, and the like of at least one of the applications 370.

The power manager 345 may operate together with a basic input/output system (BIOS), may manage a battery or power, and may provide power information and the like used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity, such as, for example, Wi-Fi and BT. The notification manager 349 may display or report, to the user, an event, such as an arrival message, an appointment, a proximity alarm, and the like in such a manner as not to disturb the user. The location manager 350 may manage location information of the electronic device. The graphic manager 351 may manage a graphic effect, which is to be provided to the user, and/or a user interface related to the graphic effect. The security manager 352 may provide various security functions used for system security, user authentication, and the like. According to an embodiment of the present disclosure, when the electronic device (e.g., the electronic device 101) has a telephone function, the middleware 330 may further include a telephony manager (not illustrated) for managing a voice telephony call function and/or a video telephony call function of the electronic device.

The middleware 330 may generate and use a new middleware module through various functional combinations of the above-described internal element modules. The middleware 330 may provide modules specialized according to types of OSs in order to provide differentiated functions. In addition, the middleware 330 may dynamically delete some of the existing elements, or may add new elements. Accordingly, the middleware 330 may omit some of the elements described in the various embodiments of the present disclosure, may further include other elements, or may replace the some of the elements with elements, each of which performs a similar function and has a different name.

The API 360 (e.g., the API 145) is a set of API programming functions, and may be provided with a different configuration according to an OS. In the case of Android or iOS, for example, one API set may be provided to each platform. In the case of Tizen, for example, two or more API sets may be provided to each platform.

The applications 370 (e.g., the applications 147) may include, for example, a preloaded application and/or a third party application. The applications 370 may include, for example, a home application 371, a dialer application 372, a short message service (SMS)/multimedia message service (MMS) application 373, an instant message (IM) application 374, a browser application 375, a camera application 376, an alarm application 377, a contact application 378, a voice dial application 379, an electronic mail (e-mail) application 380, a calendar application 381, a media player application 382, an album application 383, a clock application 384, and any other suitable and/or similar application.

At least a part of the programming module 300 may be implemented by instructions stored in a non-transitory computer-readable storage medium. When the instructions are executed by one or more processors (e.g., the processor 210), the one or more processors may perform functions corresponding to the instructions. The non-transitory computer-readable storage medium may be, for example, the memory 230. At least a part of the programming module 300 may be implemented (e.g., executed) by, for example, the processor 210. At least a part of the programming module 300 may include, for example, a module, a program, a routine, a set of instructions, and/or a process for performing one or more functions.

Names of the elements of the programming module (e.g., the programming module 300) according to an embodiment of the present disclosure may change depending on the type of OS. The programming module according to an embodiment of the present disclosure may include one or more of the above-described elements. Alternatively, some of the above-described elements may be omitted from the programming module. Alternatively, the programming module may further include additional elements. The operations performed by the programming module or other elements according to an embodiment of the present disclosure may be processed in a sequential method, a parallel method, a repetitive method, or a heuristic method. In addition, some of the operations may be omitted, or other operations may be added to the operations.

According to various embodiments of the present disclosure, a front end module may support a first communication and a second communication. The second communication may be a communication using a part of an uplink band among frequency bands that the first communication uses. An electronic device may use the uplink frequency band when transmitting a signal to a base station, and may use downlink frequency band when receiving a signal from the base station. Accordingly, the second communication may be a communication using a partial frequency band of the uplink frequency band among the frequency bands that the first communication uses. Further, the second communication may mean a communication scheme to perform direct communication between terminals, and the first communication may means a communication scheme through the base station.

According to various embodiments of the present disclosure, the first communication may mean a communication supporting long term evolution (LTE) that is the $4^{th}$ generation mobile communication standard, and the second communication may mean a device to device (D2D) communication scheme defined in the LTE standards. The D2D communication scheme defined in the LTE standards may mean a scheme to perform direct communication between terminals using a partial frequency band of an uplink band (that may mean a frequency band used when the electronic device transmits a signal to the base station). Accordingly, the second communication may mean LTE D2D, and the first communication may mean LTE.

Figure 4:
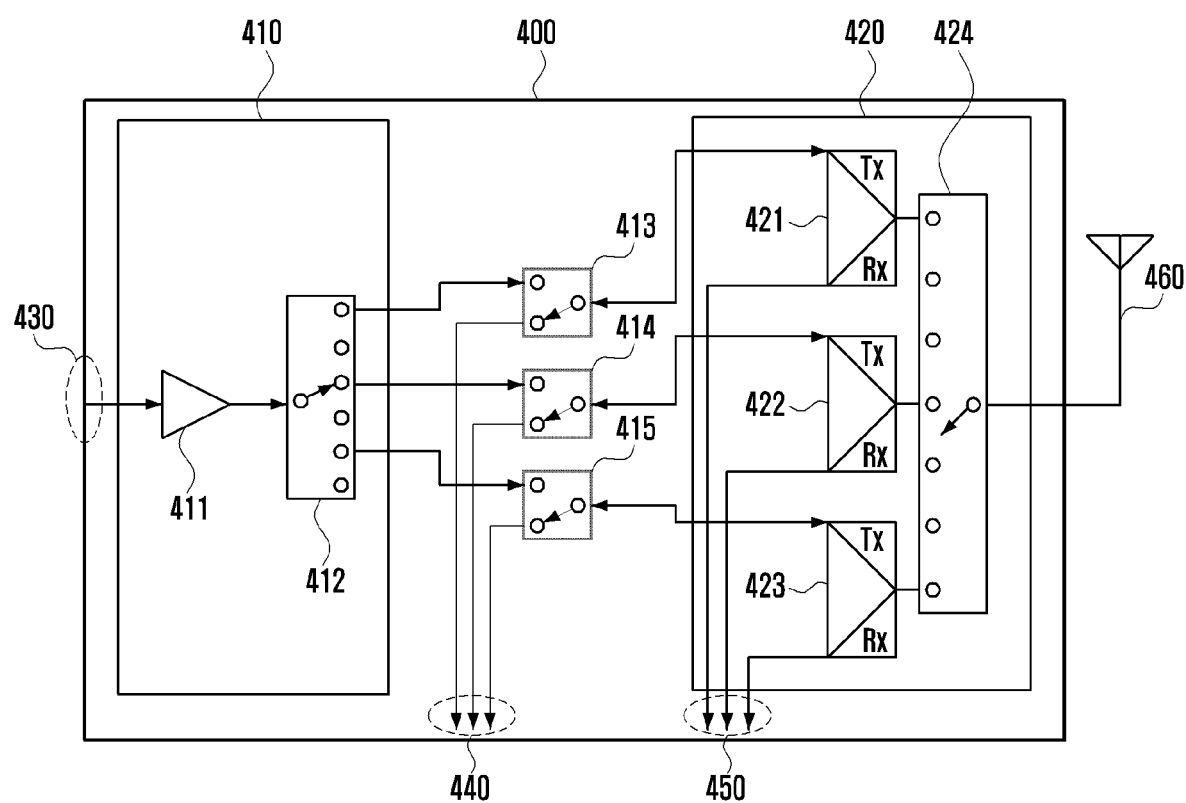
FIG. 4 illustrates, in block diagram format, a front end module connected to an antenna according to various embodiments of the present disclosure.

FIG. 4 illustrates, in block diagram format, a front end module connected to an antenna according to various embodiments of the present disclosure.

Referring to FIG. 4, a front end module connected to an antenna 460 according to an embodiment of the present disclosure may include a first port 430, a second port 440, a third port 450, an amplifier 411, first to fifth switches 412, 413, 414, 415, and 424, and a plurality of duplexers 421, 422, and 423.

The amplifier 411 may receive an input of a transmission (Tx) signal of a first communication and a Tx signal of a second communication, and may amplify the Tx signals. The amplifier 411 may transmit the amplified Tx signal to the first switch 412. The Tx signal may mean a transmitted signal that an electronic device outputs using the antenna among communication signals. The receive (Rx) signal may mean a received signal that the electronic device receives using the antenna among the communication signals.

According to various embodiments of the present disclosure, the front end module illustrated in FIG. 4 may support communication on a plurality of frequency bands. For this, the front end module may include the plurality of duplexers 421, 422, and 423, and each of duplexers 421, 422, and 423 may be used in different frequency bands.

The plurality of duplexers 421, 422, and 423 may separate the Tx and Rx signals from the signals transmitted/received through the antenna 430 in different frequency bands. For example, the front end module 400 may include the duplexer 421 supporting a first frequency band, the duplexer 422 supporting a second frequency band, and the duplexer 423 supporting a third frequency band. Various numbers of duplexers may be deployed according to the number of frequency bands supported by the front end module 400.

The first port 430 may mean a port through which the Tx signal of the first or second communication is input. The second port 440 may mean a port through which the Rx signal of the second communication is output. The third port 450 may mean a port through which the Rx signal of the first communication is output.

In certain embodiments according to this disclosure, first switch 412 enables the Tx signal which is amplified by the amplifier 411 to be transmitted to any one of the second switch 413, the third switch 414, and the fourth switch 415. For this, the first switch 412 enables a pole connected to an output of the amplifier 411 to be connected to any one of a pole corresponding to the second switch 413, a pole connected to the third switch 414, and a pole connected to the fourth switch 415. According to various embodiments of the present disclosure, the first switch 412 may connect the pole connected to the output of the amplifier 411 to the switch connected to the duplexer corresponding to the frequency band of the Tx signal.

In some embodiments, the second switch 413, the third switch 414, and the fourth switch 415 enable the signals output from the Tx ports of the plurality of duplexers 421, 422, and 423 to be received in the second port 440. Further, the second to fourth switches 413 to 415 enable the Tx signal of the first communication or the Tx signal of the second communication, which is transmitted from the first port 430 and is amplified by the amplifier 411, to be transmitted to any one of the plurality of duplexers through the first switch 412.

According to certain embodiments, it may be assumed that a signal of the first frequency band is transmitted using the antenna 460, and the signal of the first frequency band input through the first port 430 may be amplified by the amplifier 411. The amplified signal may reach the duplexer 421 that supports the first frequency band through the first switch 412 and the second switch 413. The amplified signal may be transferred to the antenna 460 using the Tx port of the duplexer 421 and the fifth switch 424, and the antenna 460 may radiate the amplified signal.

If it is assumed that the signal of the first frequency band is received through the antenna 460, the signal of the first frequency band may reach the duplexer 421 supporting the first frequency band through the fifth switch 424. If the signal of the first frequency band is the Rx signal of the first communication, the duplexer 421 may transmit the signal to the third port 450. If the signal of the first frequency band is the Rx signal of the second communication, the duplexer 421 may transmit the signal to the second port 440 through the Tx port of the duplexer 421 and the second switch 413.

Although, in this non-limiting example, it is assumed that the signal of the first frequency band is received through the antenna 460, the same process may be applied even in the case where the signal of the second frequency band or the third frequency band is received through the antenna 460

According to certain embodiments of the present disclosure, a structure of the front end module as described above with reference to FIG. 4 can support transmission/reception of the first communication and transmission/reception of the second communication using the uplink frequency band of the first communication, and can also support transmission/reception of the first communication and the second communication using a plurality of frequency bands. In this non-limiting example, it is assumed that the configurations illustrated in FIG. 4 support three frequency bands. However, the number of supportable frequency bands is not limited, and the number of configurations may be changed according to the number of supportable frequency bands.

In some embodiments, the front end modules 400 illustrated in FIG. 4 may be integrally implemented into one module. According to another embodiment of the present disclosure, the front end module 400 may be implemented through combination of one module (multimode multiband) 410 in which the amplifier 411 and the first switch 412 are integrated and one module in which the plurality of duplexers 421, 422, and 423 and the fifth switch 424 are integrated.

Figure 5:
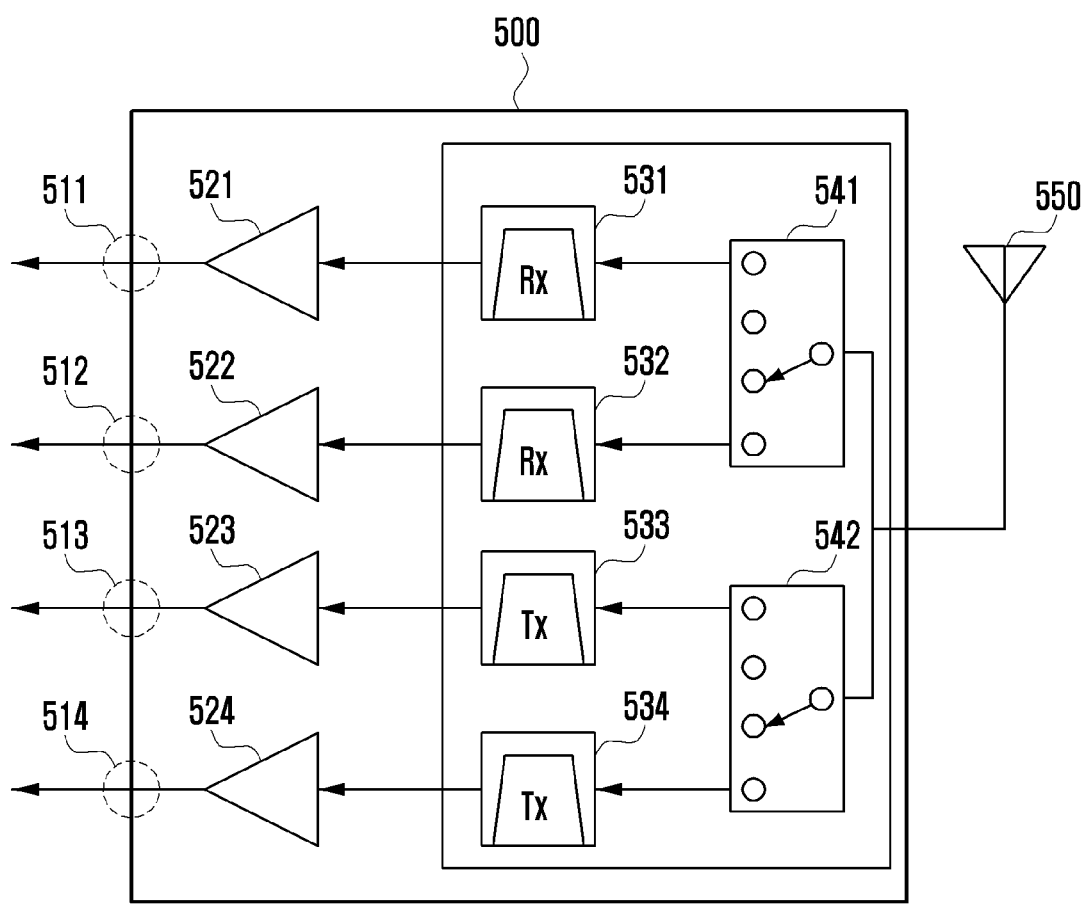
FIG. 5 illustrates, in block diagram format, a front end module connected to a diversity antenna according to an embodiment of the present disclosure.

FIG. 5 illustrates in block diagram format, a front end module connected to a diversity antenna according to certain embodiments of the present disclosure.

According to embodiments of the present disclosure, the term diversity antenna encompasses an antenna supporting diversity reception for preventing the communication from being unstable due to fading of the signal. The diversity reception may include various types, such as frequency diversity reception and time diversity reception. However, since this is well known to those skilled in the art, any explanation thereof will be omitted.

Referring to the non-limiting example of FIG. 5, a front end module 500 connected to a diversity antenna 550 according to an embodiment of the present disclosure may include first to fourth ports 511 to 524, a plurality of amplifiers 521 to 524, reception band filters 531 and 532, transmission band filters 533 and 534, a first switch 541, and a second switch 542.

According to certain embodiments of the present disclosure, first port 511 and the second port 512 encompass ports through which diversity Rx signals of the first communication are output, and the third port 513 and the fourth port 514 encompass ports through which diversity Rx signals of the second communication are output. According to various embodiments of the present disclosure, the first port 511 and the third port 513 encompass the ports through which the Rx signals of the first frequency band are output, and the second port 512 and the fourth port 514 encompass the ports through which the Rx signals of the second frequency are output.

The amplifiers 521 to 524 may receive the Rx signals of the first communication and the Rx signals of the second communication, and may amplify the Rx signals. For example, the amplifiers 521 to 524 may be implemented by low-noise amplifiers (LNAs). The amplified signals may be output through the ports connected to the respective amplifiers.

According to certain embodiments of the present disclosure, reception band filters 531 to 532 may filter the Rx band signals (or downlink band signals) among the signals received through an antenna 550. The transmission band filters 533 to 534 may filter the Tx band signals (or uplink band signals) among the signals received through the antenna 550.

According to various embodiments of the present disclosure, the front end module illustrated in FIG. 5 supports communication on a plurality of frequency bands. For this, the front end module may include the plurality of reception band filters 531 to 532 and the plurality of transmission band filters 533 to 534, and the plurality of reception band filters 531 to 532 and the transmission band filters 533 to 534 may be used in different frequency bands. For example, the front end module 500 may be provided with the reception band filter 531 and the transmission band filter 533 supporting the first frequency band, and the reception band filter 532 and the transmission band filter 534 supporting the second frequency band.

The first switch 541 and the second switch 542 may connect any of the filters connected to the switches to the antenna 550 according to the frequency band that can be received through the antenna 550. For example, in the case of performing the first communication or the second communication using the second frequency band, the first switch 541 may connect the port of the antenna 550 to the reception band filter 532 supporting the second frequency band, and the second switch 542 may connect the port of the antenna 550 to the transmission band filter 534 supporting the second frequency band. As described above, according to certain embodiments, the second communication corresponds to the band using a part of the uplink band among the frequency bands that the first communication uses. In order to receive the signal of the uplink band, the transmission band filter may, in some embodiments, be necessary. Accordingly, in order to receive the diversity reception signal of the second communication in the front end module 500 supporting the diversity of the second communication, the transmission band filters 533 and 534 may be used.

The front end module 500 illustrated in FIG. 5 may support both the diversity reception of the first communication and the diversity reception of the second communication. In this non-limiting example, it is assumed that the configurations illustrated in FIG. 5 support two frequency bands. However, the number of supportable frequency bands is not limited, and the number of configurations may be changed according to the number of supportable frequency bands.

According to some embodiments, reception band filters 531 and 532, the transmission band filters 533 and 534, the first switch 541, and the second switch 542 as illustrated in FIG. 5 may be implemented as one module.

Figure 6A:
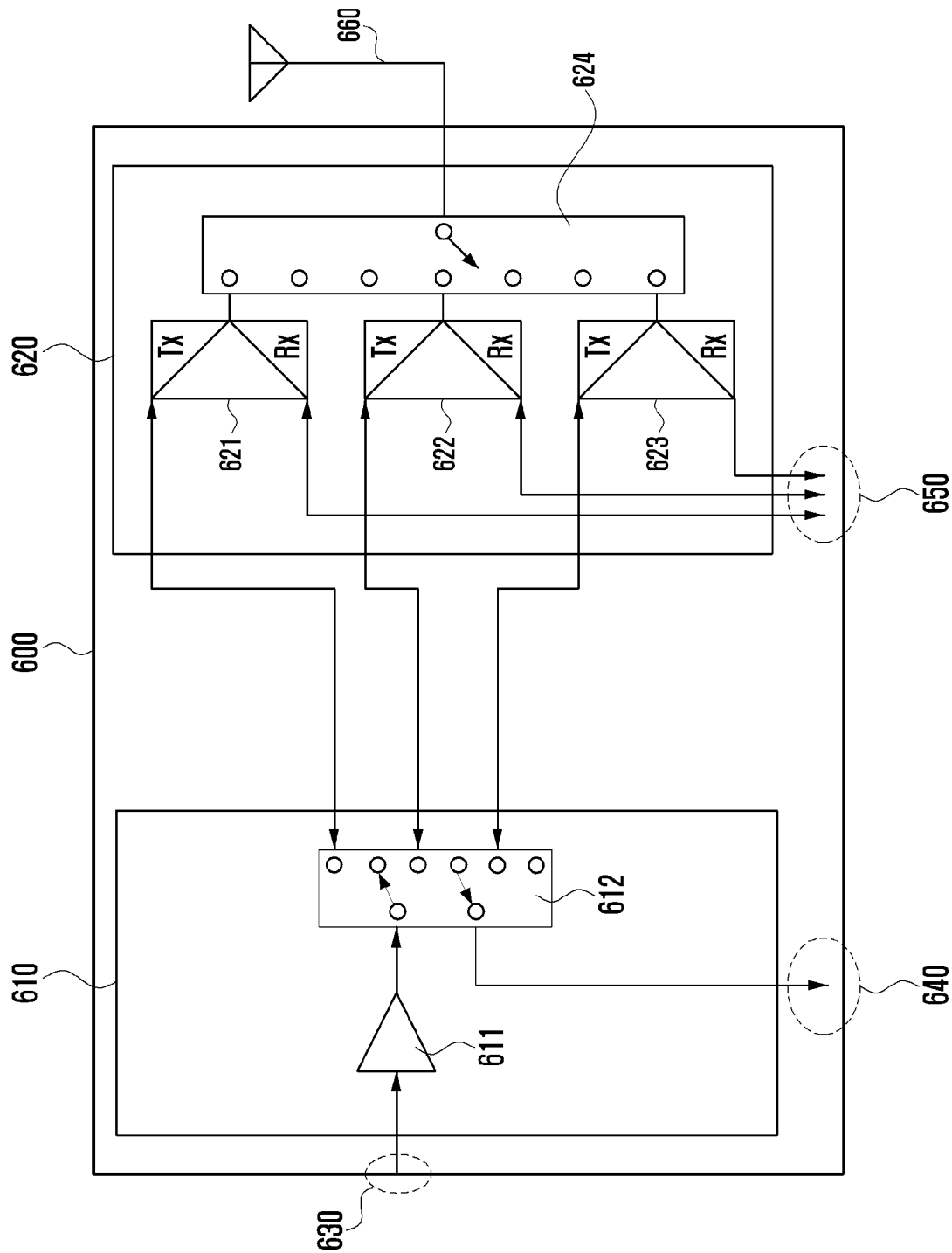
FIG. 6A illustrates, in block diagram format, a front end module connected to an antenna according to an embodiment of the present disclosure.

FIG. 6A illustrates, in block diagram format, a front end module connected to an antenna according to certain embodiments of the present disclosure.

According to some embodiments, front end module 400 illustrated in FIG. 4 may include the second to fourth switches 413 to 415. However, the plurality of switches may, in some embodiments, occupy a considerable portion of the front end module 400 to reduce spatial efficiency. Further, referring to the second port 440, as the number of signal lines connected to the second switch to the fourth switch 413 to 415 is increased; the size of the second port 440 may also be increased. Although, in the non-limiting example of FIG. 4, the front end module supports three frequency bands, the number of switches can be increased as the number of supportable frequency bands is increased, and efficiency of the spatial deployment may be reduced as the size of the second port is increased. FIG. 6A illustrates a front end module structure that can avoid the potential problems as described above.

Referring to the example of FIG. 6A, according to certain embodiments, a front end module 600 connected to an antenna 660 may include first to third ports 630 to 650, an amplifier 611, a first switch 612, a plurality of duplexers 621 to 623, and a second switch 624.

According to some embodiments, first port 630 may receive an input of a Tx signal of the first communication and a Tx signal of the second communication, and the second port 640 may output an Rx signal of the second communication. The third port 650 may output an Rx signal of the first communication.

The amplifier 611 may receive the Tx signal of the first communication or the Tx signal of the second communication, and may amplify the Tx signals. The amplifier 611 may transmit the amplified Tx signals to the first switch 612.

According to various embodiments of the present disclosure, the front end module illustrated in FIG. 6A may support communication of a plurality of frequency bands. For this, the front end module may include the plurality of duplexers 621, 622, and 623, and the plurality of duplexers 621, 622, and 623 may be used in different frequency bands.

According to certain embodiments, first switch 612 has an input (or output) that is connected to Tx ports of the duplexers 621 to 623, and the input may include a pole to which the signal output from the amplifier 611 is input and a pole connected to a signal line that is connected to the second port. According to at least one embodiment of the present disclosure, the first switch 612 may be a switch composed of two poles and a plurality of outputs (or inputs). For example, the first switch 612 may be a switch implemented in the form of x pole x throw (xPxT). In FIG. 6A, the first switch 612 is illustrated as a switch implemented in the form of double pole x throw (DPxT), but it may be implemented by a switch having various forms (e.g., switch having three poles and four throws) rather than the DPxT form. If the first switch 612 is a switch in the DPxT form, the two poles may be connected to the signal line connected to the first port 630 and the signal line connected to the second port 640. According to some embodiments, front end module 600 illustrated in FIG. 6A may be in the form in which the first switch 412 of the front end module 400 illustrated in FIG. 4 is replaced by the first switch 612 implemented in the DPxT form, and the second to fourth switches 413 to 415 are deleted from the front end module 400. In some embodiments, by implementing the first switch 412 in the DPxT form, the second to fourth switches 413 to 415 become unnecessary, and thus the space occupied by the second to fourth switches 413 to 415 can be reduced to achieve miniaturization of the front end module. Further, through the first switch 612 implemented in the DPxT form, the signal lines connected between each pole of the second to fourth switches 413 to 415 and the second port 440 can be integrated into one line, and thus miniaturization of the components can be achieved.

According to certain embodiments, it is assumed that the signal of the first frequency band is transmitted using the antenna 660, and the signal of the first frequency band input through the first port 630 may be amplified by the amplifier 611. The amplified signal may reach the duplexer 621 that supports the first frequency band through the first switch 612. The amplified signal may be transferred to the antenna 660 using the Tx port of the duplexer 621 and the second switch 624, and the antenna 660 may radiate the amplified signal.

According to certain embodiments, it is assumed that the signal of the first frequency band is received through the antenna 660, and the signal of the first frequency band may reach the duplexer 621 supporting the first frequency band through the second switch 624. If the signal of the first frequency band is the Rx signal of the first communication, the duplexer 621 may transmit the signal to the third port 650. If the signal of the first frequency and is the Rx signal of the second communication, the signal of the first frequency band may be transmitted to the second port 640 through the Tx port of the duplexer 621 and the first switch 612. In the above-described example, it can be assumed that the signal of the first frequency band is received through the antenna 660. However, in some embodiments, the same process may be applied even where the signal of the second frequency band or the third frequency band is received through the antenna 660.

The structure of the front end module as described above with reference to the non-limiting of example FIG. 6A can support transmission/reception of the first communication and transmission/reception of the second communication using the uplink frequency band of the first communication, and can also support transmission/reception of the first communication and the second communication using the plurality of frequency bands. According to some embodiments, it is assumed that the configurations illustrated in FIG. 6A supports three frequency bands. However, the number of supportable frequency bands is not so limited, and the number of configurations may be changed according to the number of supportable frequency bands.

According to certain embodiments, if the second communication means a communication type using the LTE D2D communication standard and the first communication means a communication type using the LTE communication standard, the front end modules 600 illustrated in FIG. 6A may support simultaneously performing discovery and communication operations defined in the LTE D2D standard. In order to support search performance, certain embodiments can simultaneously receive the Rx signal of the first communication and the Rx signal of the second communication. Referring to FIG. 6A, according to certain embodiments, duplexers 621 to 623 simultaneously output the Tx and Rx signals through their Tx and Rx ports, and are structured to simultaneously output the Rx signals of the second communication through the second ports 640, and the Rx signals of the first communication through the third ports 659.

In some embodiments according to this disclosure, front end module 600 illustrated in FIG. 6A may be implemented separately into a chip in which the amplifier 611 is implemented, a chip in which the first switch 612 is implemented, a chip in which the duplexers 621 to 623 are implemented, and a chip in which the second switch 624 is implemented. Further, the front end module 600 may be separately implemented in a chip in which the amplifier 611 and the first switch 612 are integrally implemented, and a chip in which the duplexers 621 to 623 and the second switch 624 are integrally implemented.

Figure 6B:
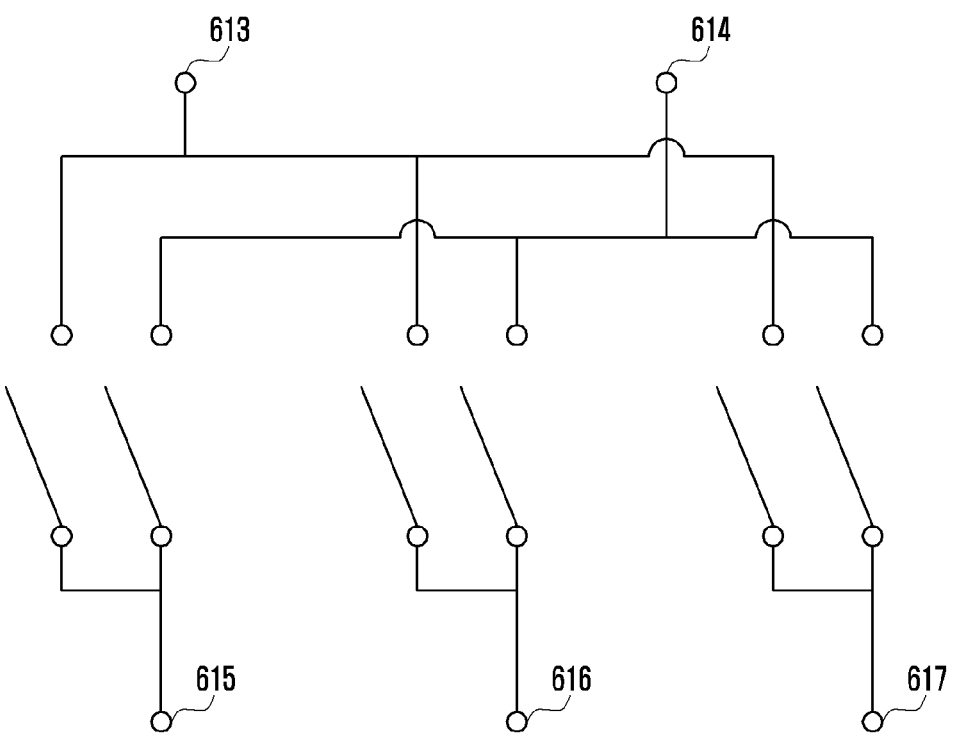
FIGS. 6B and 6C illustrate aspects of a first switch implemented in the front end module, according to certain embodiments of the present disclosure, such as illustrated in FIG. 6A.
Figure 6C:
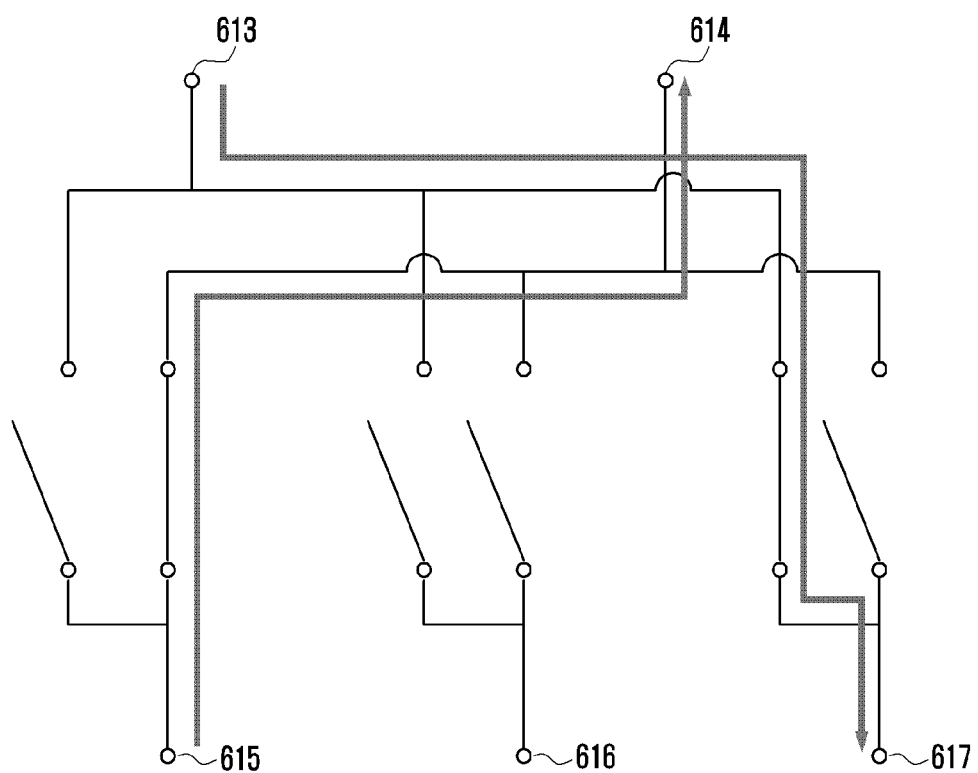

FIGS. 6B and 6C illustrate aspects of a first switch 612 implemented within a front end module, (for example, front end module 600 illustrated in FIG. 6A) according to certain embodiments of this disclosure.

According to certain embodiments, ports 613 and 614 may be implemented on one side of the first switch 612 illustrated in FIG. 6B, and three ports 615, 616, and 617 may be implemented on the other side of the first switch 612. That is, the first switch implemented as illustrated in FIGS. 6B to 6C may be a switch implemented in the form of 2P3T.

The two ports on one side of the first switch 612 may be connected to one or more of the three ports on the other side of the first switch 612. Referring to the non-limiting example of FIG. 6C, the port 613 implemented on one side of the first switch 612 may be connected to the port 617 implemented on the other side of the first switch 612. Further, the port 614 implemented on one side of the first switch 612 may be connected to the port 615 implemented on the other side of the first switch 612.

Further, according to certain embodiments, the two ports implemented on one side of the first switch 612 may be simultaneously connected to one port implemented on the other side of the first switch 612. For example, the ports 613 and 614 implemented on one side of the first switch 612 may be simultaneously connected to the port 615 implemented on the other side of the first switch 612.

Figure 7:
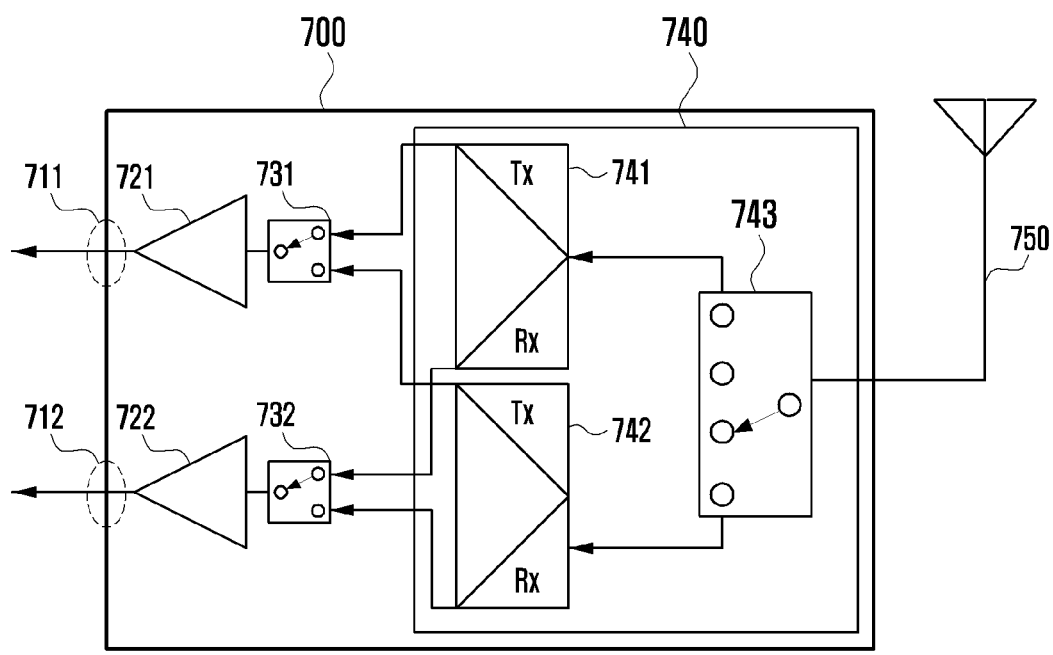
FIG. 7 illustrates, in block diagram format, a front end module connected to a diversity antenna according to certain embodiments of the present disclosure.

FIG. 7 illustrates, in block diagram format, a front end module connected to a diversity antenna according to certain embodiments of the present disclosure.

Referring to the non-limiting example of FIG. 7, a front end module 700 connected to a diversity antenna according to at least one embodiment of the present disclosure may include a first port 711, a second port 712, amplifiers 721 to 722, a first switch 731; a second switch 732, duplexers 741 to 742, and a third switch 743.

The first port 711 may comprise a port from which a diversity Rx signal of a second communication is output. If the front end module 700 supports a plurality of frequency bands, the first port 711 may output the Rx signal of the second communication corresponding to the respective frequency bands. In FIG. 7, through an operation of the first switch 731, one of an Rx signal output from a Tx port of the duplexer 741 supporting a first frequency band and an Rx signal output from a Tx port of the duplexer 742 supporting a second frequency band may reach the first port 711.

The second port 712 may comprise a port from which a diversity Rx signal of a first communication is output. If the front end module 700 supports a plurality of frequency bands, the second port 712 may output the Rx signal corresponding to the respective frequency bands. In FIG. 7, through an operation of the second switch 732, one of an Rx signal output from the Rx port of the duplexer 741 supporting the first frequency band and an Rx signal output from an Rx port of the duplexer 742 supporting a second frequency band may reach the second port 712.

The amplifiers 721 and 722 may receive the diversity Rx signal of the first communication or the diversity Rx signal of the second communication, and may amplify the Rx signals. For example, the amplifiers 721 and 722 may be implemented by low-noise amplifiers (LNAs).

The duplexers 741 to 742 may separate the Rx signal and the Tx signal from the signals received through the antenna. In particular, the duplexers according to various embodiments of the present disclosure may support different frequency bands. For example, the first duplexer 741 may separate the Rx signal and the Tx signal from the signals of the first frequency band. The second duplexer 742 may separate the Rx signal and the Tx signal from the signals of the second frequency band. Although FIG. 7 illustrates two duplexers, the number of duplexers may differ according to the number of supported frequency bands.

The third switch 743 may be connected to the antenna 750 and any one of the plurality of duplexers 741 to 742.

The front end module structure as described above with reference to the non-limiting example of FIG. 7 may support the diversity reception of the first communication and the diversity reception of the second communication, and may support both the diversity receptions of the first communication and the second communication using the plurality of frequency bands. In this non-limiting example, it is assumed that the configurations illustrated in FIG. 7 support two frequency bands. However, the number of supportable frequency bands is not so limited, and the number of configurations may be changed according to the number of supportable frequency bands.

If the second communication comprises the communication type using the LTE D2D communication standard, and the first communication comprises the communication type using the LTE communication standard, the front end module 700 as illustrated in FIG. 7 and the front end module 600 as illustrated in FIG. 6 may support simultaneous performance of discovery and communication defined in the LTE D2D. In order to perform the communication, certain embodiments simultaneously receive the Rx signal of the first communication and the Rx signal of the second communication. Referring to FIG. 7, the Rx signal of the second communication (it is assumed that it corresponds to the first frequency band) may be transmitted to the first port 711 through the Tx port of the duplexer 741, and the Rx signal of the first communication (it is assumed that it corresponds to the first frequency band) may be simultaneously transmitted to the second port 712 through the Rx port of the duplexer 741. Accordingly, the front end module 800 may simultaneously receive the Rx signal of the LTE D2D and the Rx signal of the LTE.

According to certain embodiments, the front end module illustrated in FIG. 7, the plurality of duplexers 741 and 742 and the third switch 743 may be implemented into one module.

Figure 8:
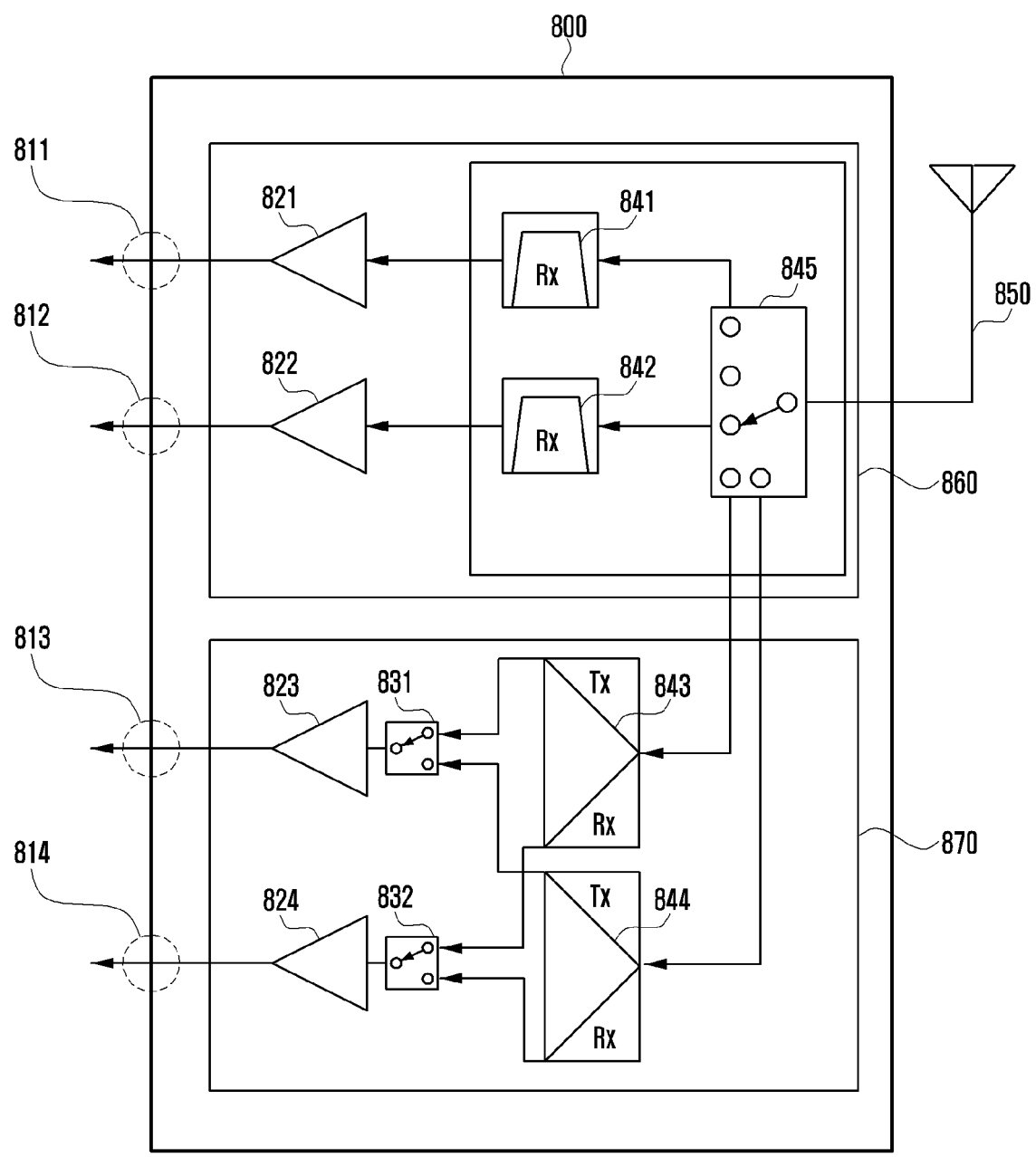
FIG. 8 illustrates, in block diagram format, a front end module connected to a diversity according some embodiments of the present disclosure.

FIG. 8 illustrates, in block diagram format, a front end module connected to diversity according certain embodiments of the present disclosure.

Referring to FIG. 8, a front end module 800 connected to the diversity according to another embodiment of the present disclosure may include a first front end module 860 and a second front end module 870.

According to some embodiments, first front end module 860 may include a first port 811, a second port 812, amplifiers 821 and 822, reception band filters 841 and 842, and a switch 845. The first front end module 860 may comprise a front end module supporting diversity reception of a first communication. According to at least one embodiment of the present disclosure, the second front end module 870 may comprise a front end module that is unable to support the diversity reception of the first communication. This is because, in some embodiments, since a second communication is a communication type that is performed using an uplink frequency band of the first communication, transmission band filters may be required, but the first front end module 860 does not require the transmission band filters.

The second front end module 870 may include amplifiers 823 and 824, a third port 813, a fourth port 814, a second switch 831, a third switch 832, and duplexers 843 to 844. The amplifiers 823 and 924 may amplify received signals. According to various embodiments of the present disclosure, the amplifiers 823 and 824 may be implemented by low-noise amplifiers (LNAs). Since the constituent elements of the second front end module 870 are the same as those of the front end module 700 as illustrated in FIG. 7, the duplicate explanation thereof will be omitted.

According to certain embodiments, second front end module 870 may be coupled to an auxiliary (AUX) port of the first switch 845 included in the first front end module 860. Accordingly, the D2D communication can be supported through a simple combination with the front end module that does not support the existing D2D communication (it may correspond to the first front end module).

According to certain embodiments, the second communication comprises the communication type using the LTE D2D communication standard, and the first communication comprises the communication type using the LTE communication standard, the front end module 800 as illustrated in FIG. 8 and the front end module 600 as illustrated in FIG. 6 that interlocks with the front end module 800 may support simultaneous performance of discovery and communication defined in the LTE D2D standard. In order to perform the communication, certain embodiments simultaneously receive the Rx signal of the first communication and the Rx signal of the second communication. Referring to FIG. 8, according to some embodiments, the Rx signal of the second communication (in this non-limiting example, it is assumed that it corresponds to the first frequency band) may be transmitted to the third port 813 through the Tx port of the duplexer 843, and the Rx signal of the first communication (in this non-limiting example, it is assumed that it corresponds to the first frequency band) may be simultaneously transmitted to the fourth port 814 through the Rx port of the duplexer 843. Accordingly, the front end module 800 may simultaneously receive the Rx signal of the LTE D2D and the Rx signal of the LTE.

Figure 9:
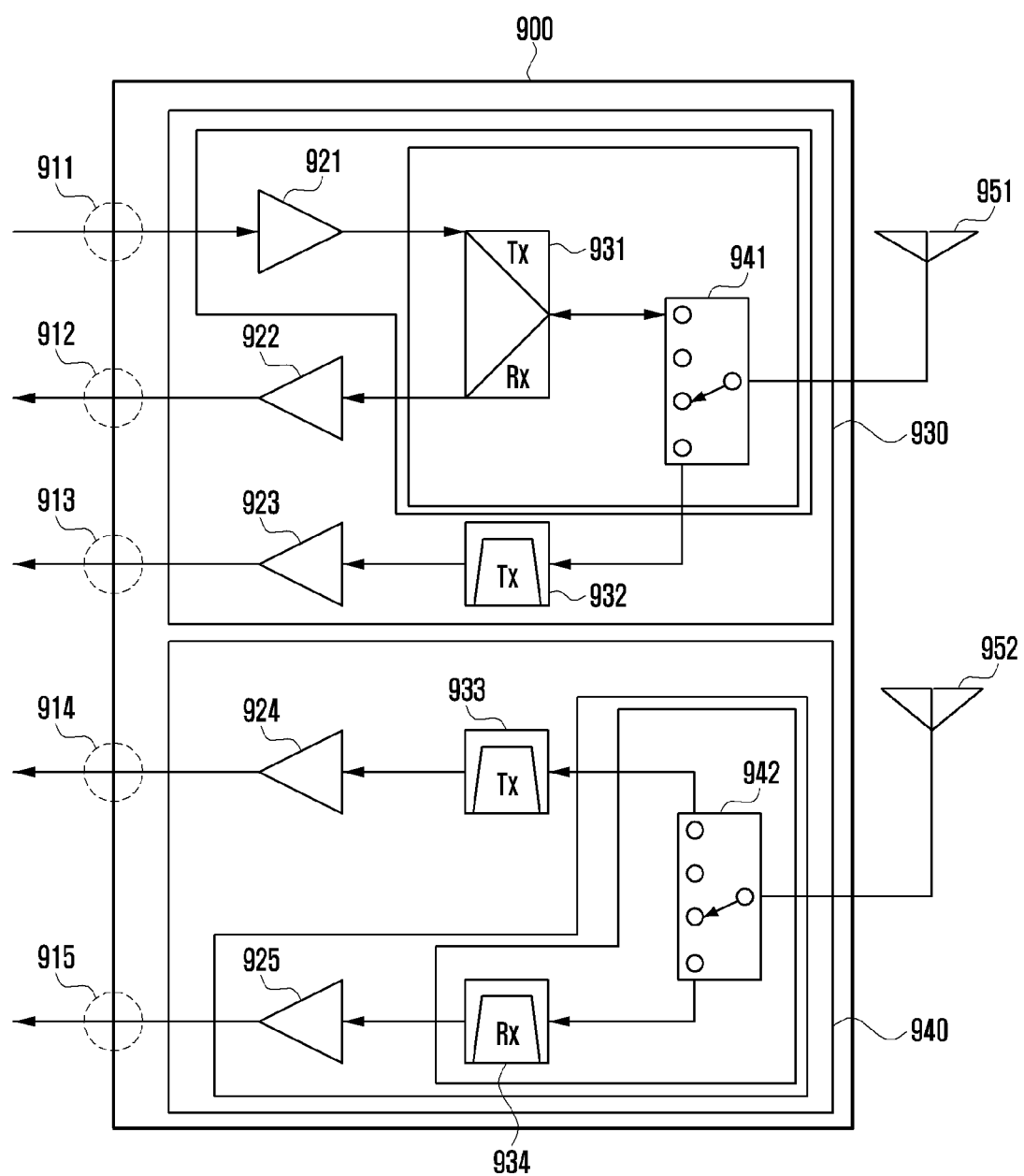
FIG. 9 illustrates, in block diagram format, an electronic device to which front end modules are applied according to certain embodiments of the present disclosure.

FIG. 9 illustrates, in block diagram format, an electronic device to which front end modules are applied according to certain embodiments of the present disclosure. Certain embodiments of an electronic device 900, such as illustrated in FIG. 9 may include a first front end module 930 connected to an antenna 951 and a second front end module 940 connected to an antenna 952 that performs diversity reception with the first front end module 930.

The first front end module 930 may include first to third ports 911 to 913, and the second front end module 940 may include fourth to fifth ports 914 and 915. The first port 911 may receive an input of a Tx signal of a first communication and a Tx signal of a second communication. The second port 912 may output an Rx signal of the first communication. The third port 913 may output an Rx signal of the second communication. The fourth port 914 may output a diversity Rx signal of the second communication, and the fifth port 915 may output a diversity Rx signal of the first communication.

Amplifiers 921 to 925 may amplify input signals to output the amplified signals.

Further, the first front end module 930 may include a plurality of duplexers including a first duplexer 931, and a first switch 941 connecting the antenna 951 to any one of the plurality of duplexers. The first switch 941 included in the first front end module 930 may include at least one AUX port, and through the AUX port, a transmission band filter 932 may be connected. A signal that has passed through the transmission band filter 932 may be output to the third port 913 through the amplifier 923. The signal that has passed through the transmission band filter 932 may mean the Rx signal of the second communication. The first front end module 930 excluding the transmission band filter 932 and the amplifier 923 connected to the AUX port is unable to receive the Rx signal of the second communication due to absence of the transmission band filter 932. However, the first front end module 930 can receive the Rx signal of the second communication through the transmission band filter 932 connected to the AUX port, and thus can support the second communication.

According to certain embodiments, second front end module 940 may include a plurality of reception band filters including a first reception band filter 934, an antenna 952 supporting the diversity reception, and a second switch 942 connecting one of the plurality of reception band filters. The second switch 942 may include at least one AUX port, and through the AUX port, a transmission band filter 933 may be connected. The signal that has passed through the transmission band filter 933 may be output to the third port 914 through the amplifier 924. The signal that has passed through the transmission band filter 933 may mean the diversity Rx signal of the second communication. The second front end module 940 excluding the transmission band filter 933 and the amplifier 924 connected to the AUX port is unable to receive the diversity Rx signal of the second communication due to absence of the transmission band filter 933. However, the second front end module 940 can receive the diversity Rx signal of the second communication through the transmission band filter 933 connected to the AUX port, and thus can support the diversity reception of the second communication. The electronic device 900 as illustrated in FIG. 9 can support the diversity reception of the second communication, and thus can support a search function of the second communication.

According to various embodiments of the present disclosure, a communication circuit of an electronic device may include a plurality of duplexers, a first switch configured to connect any one of the plurality of duplexers to an antenna, and a second switch configured to connect a first port, to which a Tx signal of a first communication or a Tx signal of a second communication is input, to any one of Tx ports of the plurality of duplexers, and to connect a second port, from which a Rx signal of the second communication is output, to one of the Tx ports of the plurality of duplexers, wherein the first communication supports frequency division multiplexing, and the second communication support time division multiplexing.

A frequency band of the second communication may use a transmission band of a frequency band of the first communication.

The communication circuit may further include an amplifier deployed between the first port and the second switch to amplify the Tx signal of the first communication or the Tx signal of the second communication.

The second switch may connect a pole connected to a signal line through which a signal output from the amplifier is transmitted to any one of the Tx ports of the plurality of duplexers.

The communication circuit may include a front end module included and packaged on one substrate.

One of the two poles may be connected to the first port, and the other of the two poles may be connected to the second port.

The second port may be connected to a single line coupled to signal lines output from the Tx ports of the plurality of duplexers.

The second switch may be a switch (x pole x throw (xPxT)) composed of at least two poles and a plurality of output ports.

The second communication may be a communication using a part of an uplink frequency band used by the first communication.

According to various embodiments of the present disclosure, a communication circuit of an electronic device includes a plurality of duplexers, a first switch configured to connect one of the plurality of duplexers to an antenna, a second switch configured to connect any one of Rx ports of the plurality of duplexers to a Rx port of a first communication; and a third switch configured to connect any one of Tx ports of the plurality of duplexers to a Rx port of a second communication.

The communication circuit may further include a first amplifier deployed between a reception port of the first communication and the second switch to amplify an Rx signal of the first communication, and a second amplifier deployed between a reception port of the second communication and the third switch to amplify an Rx signal of the second communication.

The second communication may be a communication type using a part of an uplink frequency band used by the first communication.

According to various embodiments of the present disclosure, an electronic device includes a first front end module connected to a first antenna, and a second front end module connected to a second antenna interlocking with the first antenna to perform diversity reception, wherein the first front end module includes a plurality of duplexers, a first switch configured to connect the first antenna to any one of the plurality of duplexers; a first transmission band filter connected to an auxiliary port of the first switch to filter a Rx signal of a second communication, and a plurality of ports connected to the plurality of duplexers and the transmission band filter, and the second front end module includes a plurality of reception band filters configured to filter Rx signals of a first communication among signals received from the second antenna, a low-noise amplifier connected to the plurality of reception band filters, a second switch configured to connect the second antenna to one of the plurality of reception band filters, and a second transmission band filter connected to an auxiliary port of the second switch to filter the Rx signal of the second communication.

The second communication may be a communication type using a part of an uplink frequency band used by the first communication.

The first transmission band filter and the second transmission band filter may be implemented by duplexers.

The first front end module may include a first port connected to a Tx port of the first duplexer among the plurality of duplexers; a second port connected to a Rx port of the first duplexer; and a third port connected to the first transmission band filter.

The first port may transmit a Tx signal using the first communication and a Tx signal using the second communication to the Tx port of the first duplexer.

The second front end module may include a fourth port connected to the second transmission band filter, and a fifth port connected to any one of the plurality of reception band filters, wherein the third port and the fourth port respectively receive a Rx signal using the second communication from the first transmission band filter and the second transmission band filter.

According to various embodiments of the present disclosure, an electronic device includes a first front end module connected to a first antenna, and a second front end module connected to a second antenna interlocking with the first antenna to perform diversity reception, wherein the first front end module includes a plurality of reception filters configured to filter a received signal of a first communication from signals received from the first antenna, a plurality of ports respectively connected to the plurality of reception filters, and a first switch configured to connect the first antenna to any one of the plurality of reception filters, and the second front end module includes a plurality of duplexers connected to an auxiliary port of the first switch to filter a Rx signal and a Tx signal of a second communication among signals received from the first antenna, a second switch configured to connect one of Tx ports of the plurality of duplexers to a first amplifier, a third switch configured to connect one of Rx ports of the plurality of duplexers to a second amplifier, and a plurality of ports connected to the first amplifier and the second amplifier.

The above-discussed method is described herein with reference to flowchart illustrations, methods, and computer program products according to example embodiments of the present disclosure. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which are executed via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide operations for implementing the functions specified in the flowchart block or blocks.

And each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

Certain exemplary aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a ROM, a RAM, compact disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various example embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various example embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

Aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. A communication circuit of an electronic device comprising:
    a plurality of duplexers including a first duplexer and a second duplexer;
    a first switch configured to connect any one of the plurality of duplexers to an antenna; and
    a second switch including at least two poles and a plurality of throws, the at least two poles including a first pole connected to a first port of the communication circuit, to which a Tx signal of a first communication or a Tx signal of a second communication is input, and a second pole connected to a second port of the communication circuit, to which a Rx signal of the second communication is output, each throw of the plurality of throws being connected to a Tx port of each duplexer of the plurality of duplexers,
    wherein the second switch is configured to:

connect the first pole to one of the plurality of throws, and connect the second pole to another of the plurality of throws, and wherein the first communication supports frequency division multiplexing, and the second communication supports time division multiplexing.

2. The communication circuit of claim 1, wherein a frequency band of the second communication uses a transmission band of a frequency band of the first communication.

3. The communication circuit of claim 1, further comprising an amplifier deployed between the first port and the second switch to amplify the Tx signal of the first communication or the Tx signal of the second communication.

4. The communication circuit of claim 3, wherein the second switch connects a pole connected to a signal line through which a signal output from the amplifier is transmitted to any one of the Tx ports of the plurality of duplexers.

5. The communication circuit of claim 3, comprising a front end module included and packaged on one substrate.

6. The communication circuit of claim 1, wherein the second port is connected to a single line coupled to signal lines output from the Tx ports of the plurality of duplexers.

7. The communication circuit of claim 1, wherein the second communication is a communication using a part of an uplink frequency band used by the first communication.

* * * * *